United States Patent
Burke et al.

[11] Patent Number: 6,048,649
[45] Date of Patent: Apr. 11, 2000

[54] PROGRAMMED DEFECT MASK WITH DEFECTS SMALLER THAN 0.1 μM

[75] Inventors: Ann Rand Burke; Denis Marc Rigaill, both of South Burlington; Jacek Grzegorz Smolinski, Jericho, all of Vt.

[73] Assignee: International Business Machines Corporation, Armonk, N.Y.

[21] Appl. No.: 09/070,625

[22] Filed: Apr. 30, 1998

[51] Int. Cl.[7] .................................................. G03F 9/00
[52] U.S. Cl. ................................................ 430/5; 430/324
[58] Field of Search .................................. 430/5, 22, 322, 430/324, 394

[56] References Cited

U.S. PATENT DOCUMENTS

| | | | |
|---|---|---|---|
| 4,762,805 | 8/1988 | Cheung et al. | 437/63 |
| 5,087,537 | 2/1992 | Conway et al. | 430/15 |
| 5,260,175 | 11/1993 | Kowanz et al. | 430/326 |
| 5,585,211 | 12/1996 | Firstein et al. | 430/30 |
| 5,804,088 | 9/1998 | McKee | 430/313 |

FOREIGN PATENT DOCUMENTS 61-061417  3/1986  Japan.

*Primary Examiner*—S. Rosasco
*Attorney, Agent, or Firm*—Howard J. Walter, Jr.

[57] ABSTRACT

A method is provided for making sublithographic structures, such as programmed defect masks. The method comprises the steps of forming a layer of base material on a substrate, the base material being selectively definable from the substrate, forming a layer of photosensitive material over the layer of material, selectively exposing a plurality of image segments in the photosensitive material in which segments are offset from each other by a sub-lithographic dimension in a first direction and a different dimension in a second direction and a sub-plurality of the segments pass over the layer of base material, and developing the photosensitive material to expose the layer within the sub-plurality of segments. Also provided is the resulting programmed defect mask with defects under 0.1 μm in size.

31 Claims, 3 Drawing Sheets

PROGRAMMED DEFECT MASK WITH DEFECTS SMALLER THAN 0.1 μM

TECHNICAL FIELD OF THE INVENTION

The invention relates to programmed defect masks used to characterize mask defect inspection systems.

BACKGROUND OF THE INVENTION

As improvements are made in wafer exposure systems, it has become increasingly important for chip manufacturers and chip testers to have the ability to identify smaller and smaller defects. Mask defect inspection systems are used to identify defects in masks. Programmed defects are sublithographic structures that are used to characterize the mask defect inspection system to ensure the defect inspection system is running smoothly. A programmed defect mask is a mask with programmed (i.e., known) defects. Programmed defect masks with defects above 0.1 μm in size presently exist.

One such programmed defect mask is made by Dupont PhotoMask, and is called the Verimask. The Verimask is built with standard lithography techniques using numerical control ("NC") data for the defect written on the mask with the images ground rules ("G/R") at the same time. As improvements are made in wafer exposure systems the minimum defect allowed is decreasing and mask inspection systems will be required to find smaller defects. A need exists to create a programmed defect mask with defects under 0.1 μm in size.

SUMMARY OF THE INVENTION

An object of the present invention is to provide a programmed defect mask with defects of under 0.1 μm in size.

Another object of the present invention is to provide a method for building a programmed defect mask with defects under 0.1 μm in size.

Another object of the present invention is to provide a method for building a programmed defect mask that has a higher level of reliability than the present state of the art.

Accordingly, a method is provided for making sublithographic structures, such as programmed defect masks. The method comprises the steps of forming a layer of base material on a substrate, the base material being selectively definable from the substrate, forming a layer of photosensitive material over the layer of material, selectively exposing a plurality of image segments in the photosensitive material in which segments are offset from each other by a sub-lithographic dimension in a first direction and a different dimension in a second direction and a sub-plurality of the segments pass over the layer of base material, and developing the photosensitive material to expose the layer within the sub-plurality of segments. Also provided is the resulting programmed defect mask with defects under 0.1 μm in size.

An advantage of the present invention is that it provides a programmed defect mask with defects of under 0.1 μm in size. The present invention also offers a high degree of repeatability. The present invention also provides a method for building a programmed defect mask with defects of under 0.1 μm in size. The method of the present invention is highly reliable, since no matter what the overlay error is between the two levels of images used in the method, at some point, the second level images have to hit the first level images and have to hit the first level images in very small increments.

DETAILED DESCRIPTION OF A PREFERRED EMBODIMENT OF THE INVENTION

The invention is directed to a sub-lithographic structure called a programmed defect mask and the method of making the mask. The programmed defect mask of the present invention has defects under 0.1 μm in size. The programmed defect mask thus is suitable to characterize a mask defect inspection system to ensure the inspection system is operating correctly and does identify defects of under 0.1 μm in size.

Figure 1:
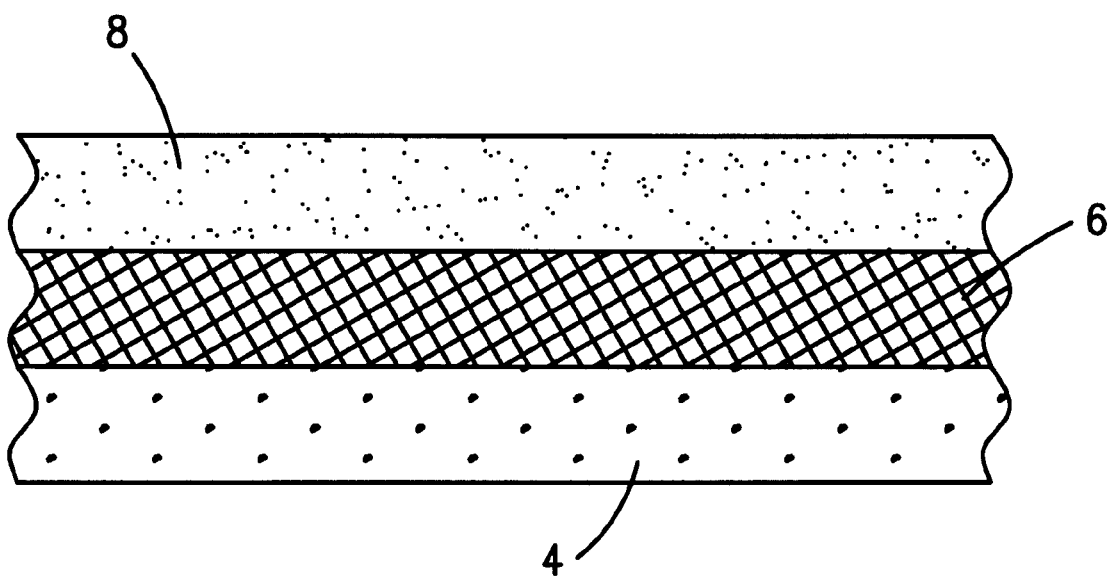
FIG. 1 shows the component materials used in the present invention to make a programmed defect mask using two levels of images.

FIG. 1 shows the component materials used in the present invention to make a programmed defect mask using two levels of images. Substrate 4 is likely to be composed of a quartz, also called a quartz plate. Other suitable materials for substrate 4 include, but are not limited to, attenuated masks and X-ray masks. The substrate 4 may be optically transparent. On top of substrate 4 is base material 6. In the preferred embodiment of the invention, base material 6 is chrome. Other suitable materials for base material 6 include, but are not limited to, attenuated PSM materials (such as those sold under the trade names Iline and DUV), X-ray absorbers, and any other material used for pattern imaging. Base material 6 is selectively definable from substrate 4. The base material 6 may be optically opaque. Photosensitive material 8 lies on top of base material 6. Examples of photosensitive material 8 include PBS resist or other kind of resist and, in general, any kind of exposure sensitive material that can be selectively removed. In some cases, both level 6 and 8 can be multiple level structures.

Figure 2:
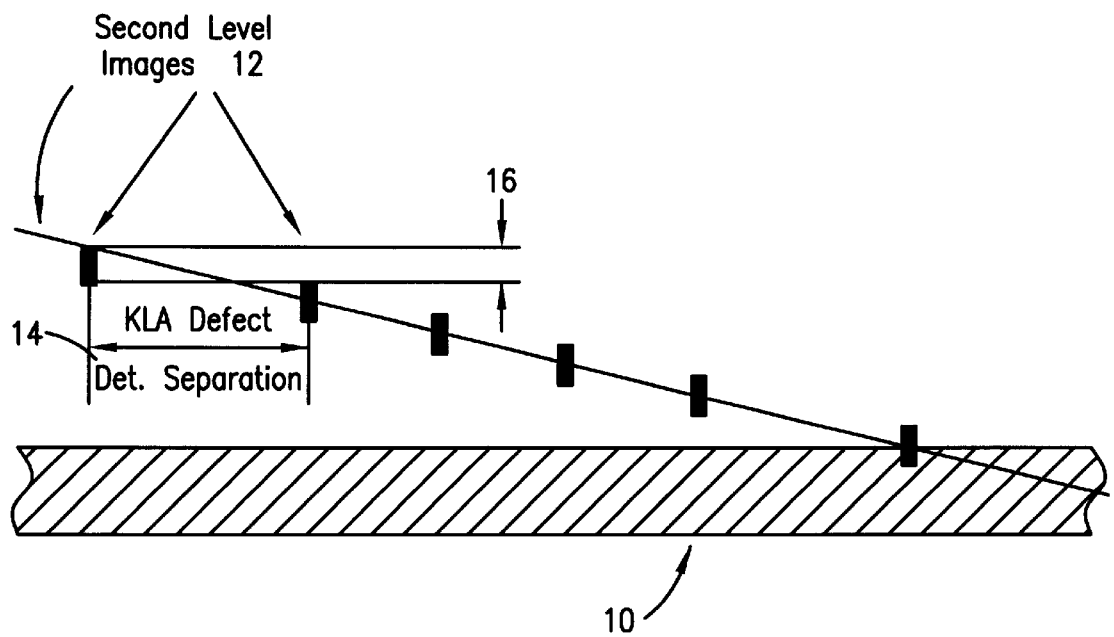
FIG. 2 shows a programmed defect mask using two levels of images in accordance with the present invention.

FIG. 2 shows a programmed defect mask using two levels of images in accordance with the present invention. FIG. 2 shows first large base geometry images (ground rules) 10. The first large base geometry images 10 are formed by selectively exposing areas of photosensitive material 8 (shown in FIG. 1). The first large base geometry images 10 are of approximately the size of 0.5 μm or smaller if lithography capability allows formation of such images. The first large base geometry images 10 may be of various types. Typically the first large base geometry images 10 repeat across the mask and create at least one edge over which the second smaller images 12 must pass.

Standard lithography techniques are used to write the first large base geometry images 10. The standard lithography techniques generally may include x-ray, ion, e-beam or optical methods. These methods are known in the industry by various trade names of their tools, including MEBES (e-beam tool), Alta and Core (both optical tools), among others. An e-beam tool generally requires a PBS or other e-beam sensitive resist. An optical tool generally requires an "895i" resist, which refers to optical resist. The standard lithography techniques may utilize dry/wet processing.

As seen in FIG. 2, a set of second smaller images 12 of various sizes, dose, and shapes is moved in a least lithography stepper motion printing on a second resist. This step size capability varies from exposure tool to exposure tool. The least lithography stepper motion is the smallest available increment for a given exposure tool with which an image can be placed on the second resist. The result of this is that the defect is incrementally imaged on the first large base geometry image 10 in horizontal positions across the mask for defect sizes. In the single level processes of the prior art there is no capacity to adjust for size, dose, shape or process. The defect types also can be programmed on vertical positions using the same second layer technique. The mask is processed for the second smaller images 12 such as by etching after the development of the second smaller images. Different process parameters are permitted for the second smaller images 12 than those used for the first large base geometry images ground rules 10. By varying the process it is possible to resolve the smaller defects. The second exposure process builds the defect images into the first exposures from the first large base geometry images 10 and the processed mask. The goal in exposing the second smaller images 12 is to produce the smallest possible defects within the first large base geometry images 10.

The first large base geometry images 12 and the second smaller images 10 thus form a plurality of image segments. The plurality of image segments of the first large base geometry images 10 and the second smaller images 12 thus are offset from each other by a first sub-lithographic dimension 16 in a first direction and a second and different sub-lithographic dimension 14 in a second direction.

One can determine the lower limit of the size of the defects to be detected, by adjusting the separation 14 between the second smaller images 12. Also relevant to the lower limit of the size of the defects to be detected is the placement least significant bit (placement LSB) 16 of the exposure tool used. The placement LSB is the increment with which placement of the exposure beam is controlled. The placement LSB 16 typically is in the range of 5 $\mu$m to 6.25 $\mu$m but could be less if permitted by a given lithography tool.

Figure 3:
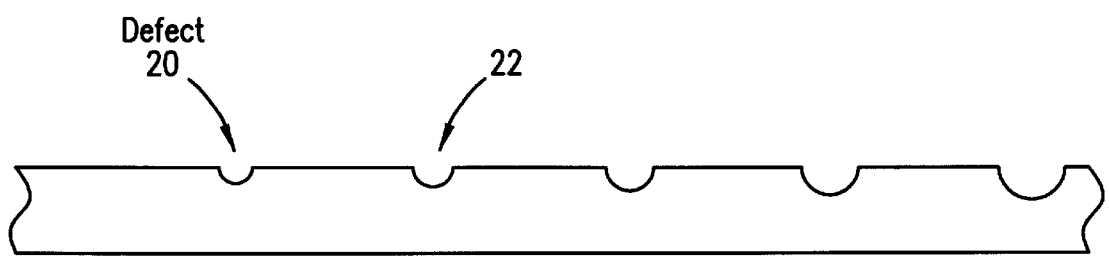
FIG. 3 shows the resulting defects in the programmed defect mask manufactured in accordance with the present invention.

FIG. 3 shows the result of the two level of images process of building a programmed defect mask performed in accordance with the present invention. FIG. 3 shows a defect 20 that is of a size between 0 and the placement LSB. The defects are arranged in a horizontal line, with each successive defect incrementally larger than the prior defect by the width of the placement LSB. For example, defect 22 is the size of defect 20 plus the placement LSB. In general, defect N (not labeled) is of a size that equals the size of defect N-1 plus the placement LSB, where the placement LSB is the size of the smallest placement step exposure tool used.

An alternative embodiment of the invention would result in a vertical arrangement of the progressively larger defects rather than a horizontal arrangement as shown in FIG. 3.

Figure 4:
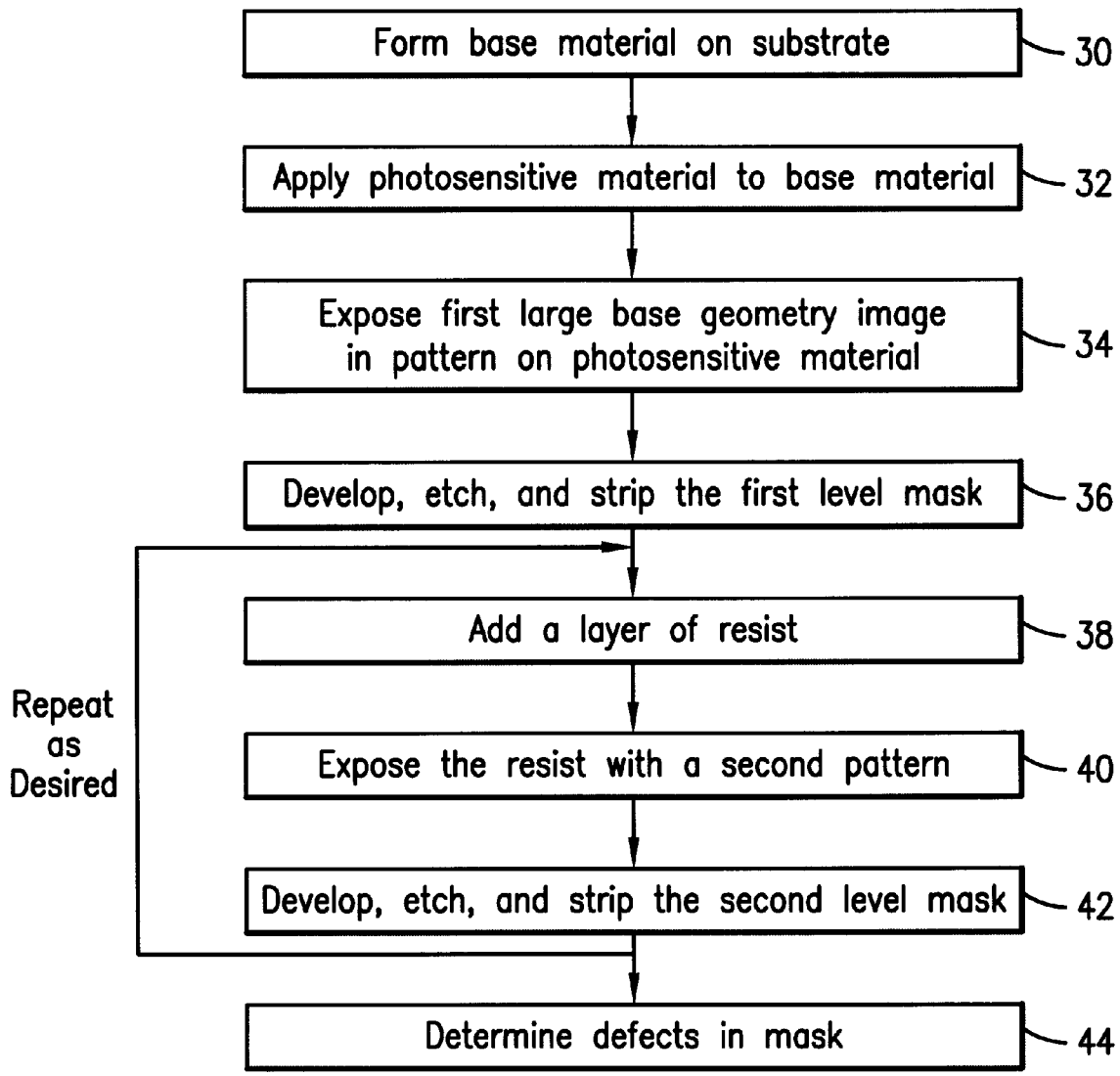
FIG. 4 is a flow chart of the method of the present invention.

FIG. 4 summarizes the steps of the method of the present invention. In step 30, a layer of base material is formed on a substrate. A layer of photosensitive material is applied to the base material in step 32. In step 34, a first large base geometry image is exposed in a pattern on the photosensitive material. Standard mask making techniques are used in step 34, as described above. In step 36, the mask is developed, etched and stripped in a standard process. An example of a standard process is PBS resist, develop etch, and strip. Other standard processes are known in the art.

In step 38, a layer of resist, such as PBS or 895i resist is applied. This is used for the second layer processing.

The layer of resist typically is on the range of 500 $\mu$m to 2 $\mu$m in thickness.

In step 40, the second level resist is exposed with various doses, shapes and processes to produce the smallest possible defects within the first large base geometry image.

In step 42, the second level mask is developed, etched and stripped. PBS resist, for example, is developed by methyl isoamyl ketone/methyl n-propyl ketone (MIAK/MNPK). The processes used for the second level mask may be the same as or different from those used with regard to the processing of the first large base geometry image. Since only defects are resolved, the method of the present invention has the advantage of permitting separate processing of the second level mask, even where the processing used for the second level mask is drastically different than the processing used for the first level mask. In some cases, using the same processes for the second level mask as the first level mask would damage the plate, so it is important to be able to use a different process for the second level mask.

In step 44, a scanning electron microscope is used to determine defect locations and sizes. Other detection means are possible.

As shown in FIG. 4, steps 38–42 can be repeated as desired.

Using the method of the present invention it is possible to develop programmed defect masks with defects under 0.1 $\mu$m in size. The programmed defect masks then are used to characterize mask defect inspection systems. Moreover, the method of the present invention offers certainty that defects of all sizes will be resolved.

Although the invention has been described with some particularity, those skilled in the art will recognize that certain changes and modifications are possible without departing from the spirit and scope of the invention. The invention is limited only by the following claims and their equivalents.

What is claimed is:

1. A method of making sub-lithographic structures comprising the steps of:
    forming a layer of base material on a substrate, said base material being selectively definable from said substrate, said base material including at least one edge;
    forming a layer of photosensitive material over said layer of base material;
    sequentially exposing a plurality of latent image segments in said photosensitive material in which segments are offset from each other by a sub-lithographic dimension in a first direction and a different dimension in a second direction and a sub-plurality of said segments pass over said at least one edge of said layer of base material; and
    developing said photosensitive material to expose said layer of base material within said sub-plurality of segments.

2. The method of claim 1 wherein said layer of base material includes an edge over which said plurality of image segments passes.

3. The method of claim 2 wherein the step of developing is followed by etching said layer exposed in said developing step.

4. The method of claim 3 wherein said different dimension is substantially greater than said sub-lithographic dimension.

5. The method of claim 4 wherein said layer of base material is optically opaque and said substrate is optically transparent.

6. The method of claim 1 wherein the base material comprises chrome.

7. The method of claim 1 wherein the photosensitive material comprises PBS resist.

8. The method of claim 7 wherein the step of developing further comprises developing the PBS resist using methyl isoamyl ketone/methyl n-propyl ketone.

9. The method of claim 1 wherein the step of selectively exposing further comprises selectively exposing the plurality of image segments using an e-beam tool or an optical tool.

10. A method of making a programmed defect mask, comprising:

forming a base material on a substrate;

applying a first layer of photosensitive material to the base material;

exposing a first large base geometry image pattern on the first layer of photosensitive material to form a first level mask;

processing the first level mask;

adding a second layer of photosensitive material on top of the first level mask;

exposing a second pattern on the second layer of photosensitive material to form a second level mask; and processing the second level mask.

11. The method of claim 10, wherein the step of processing the first level mask further comprises:

developing, etching, and stripping the first level mask.

12. The method of claim 10, wherein the step of processing the second level mask further comprises:

developing, etching, and stripping the second level mask.

13. The method of claim 10, wherein the base material is optically opaque.

14. The method of claim 10, wherein the substrate is optically transparent.

15. The method of claim 10, wherein the base material comprises chrome.

16. The method of claim 10, wherein the first layer of photosensitive material comprises PBS resist or an optical resist.

17. The method of claim 10, wherein the second layer of photosensitive material comprises PBS resist or an optical resist.

18. The method of claim 10, wherein the step of exposing the first large base geometry image pattern further comprises selectively exposing the first large base geometry image pattern using an e-beam tool or an optical tool.

19. The method of claim 10, wherein the step of exposing the second pattern further comprises selectively exposing the second pattern using an e-beam tool or an optical tool.

20. The method of claim 10, wherein the first large base geometry image pattern comprises image segments 0.5 $\mu$m or smaller in size.

21. The method of claim 10, wherein the step of exposing the second pattern further comprises using the smallest available increment of stepper motion available on the exposure tool exposing said second layer of photoresist material.

22. The method of claim 10, wherein the processing of the first level mask uses different techniques from the processing of the second level mask.

23. The method of claim 10, further comprising determining defects on the mask after the step of processing the second level mask.

24. The method of claim 10, wherein the steps of adding the second layer, exposing the second pattern, and processing the second level mask are repeated as many times as desired.

25. A programmed defect mask with defects smaller than 0.1 $\mu$m in size.

26. The programmed defect mask of claim 25, further comprising:

a substrate;

a base material on top of the substrate;

a first layer of photosensitive material on top of the substrate;

a first level mask of exposed and processed first large scale geometry images pattern on the first layer of photosensitive material;

a second layer of photosensitive material on top of the first level mask; and a second level mask of exposed and processed second smaller images patterned on the second layer of photosensitive material.

27. The programmed defect mask of claim 25, wherein the base material is optically opaque.

28. The programmed defect mask of claim 25, wherein the substrate is optically transparent.

29. The programmed defect mask of claim 25, wherein the base material comprises chrome.

30. The programmed defect mask of claim 25, wherein the first layer of photosensitive material comprises PBS resist or optical resist.

31. The programmed defect mask of claim 25, wherein the second layer of photosensitive material comprises PBS resist or optical resist.

* * * * *